(12) United States Patent
Acar et al.

(10) Patent No.: US 8,373,507 B2
(45) Date of Patent: Feb. 12, 2013

(54) POWER AMPLIFIER PROTECTION

(75) Inventors: Mustafa Acar, Eindhoven (NL); Mark Pieter van der Heijden, Den Bosch (NL); Melina Apostolidou, Enschede (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/142,029

(22) PCT Filed: Dec. 11, 2009

(86) PCT No.: PCT/IB2009/055687
§ 371 (c)(1),
(2), (4) Date: Jun. 24, 2011

(87) PCT Pub. No.: WO2010/076721
PCT Pub. Date: Jul. 8, 2010

(65) Prior Publication Data
US 2011/0254630 A1    Oct. 20, 2011

(30) Foreign Application Priority Data
Dec. 31, 2008    (EP) .................................... 08106041

(51) Int. Cl.
*H02H 7/20*    (2006.01)
(52) U.S. Cl. .......................................... 330/298; 330/51
(58) Field of Classification Search .................. 330/51, 330/84, 126, 207 P, 124 R, 295, 298
See application file for complete search history.

(56) References Cited

U.S. PATENT DOCUMENTS

| | | | | |
|---|---|---|---|---|
| 4,780,685 A | * | 10/1988 | Ferguson | .................. 330/124 D |
| 5,256,987 A | * | 10/1993 | Kibayashi et al. | ............. 330/295 |
| 5,872,481 A | * | 2/1999 | Sevic et al. | ....................... 330/51 |
| 6,064,264 A | | 5/2000 | Tarsia et al. | |
| 6,288,606 B1 | * | 9/2001 | Ekman et al. | .................... 330/51 |
| 6,819,171 B2 | * | 11/2004 | Kenington | ....................... 330/51 |
| 7,408,404 B2 | * | 8/2008 | Osman et al. | .................... 330/51 |
| 2003/0112076 A1 | | 6/2003 | Wang | |
| 2006/0001484 A1 | | 1/2006 | Paul et al. | |
| 2006/0066346 A1 | * | 3/2006 | Tat Lim et al. | .................. 326/30 |
| 2007/0058429 A1 | * | 3/2007 | Umezawa | ................ 365/185.03 |
| 2007/0096827 A1 | | 5/2007 | Nguyen | |

(Continued)

FOREIGN PATENT DOCUMENTS

JP    10-079654 A    3/1998

OTHER PUBLICATIONS

Larcher, L., et al. "Oxide Breakdown After RF Stress: Experimental Analysis and Effects on Power Amplifier Operation", IEEE 44th Ann. Int'l. Reliability Physics Symp., pp. 283-288 (2006).

(Continued)

*Primary Examiner* — Henry Choe

(57) ABSTRACT

A power amplifier, for example a class-E switching power amplifier, and corresponding method, comprising: a plurality of power transistors (16), for example twelve power transistors, providing a partitioned power transistor; and a voltage sensing module (22), comprising for example voltage dividers and inverters, digitally sensing the drain voltage (2) of the partitioned power transistor to control the number of power transistors of the plurality of power transistors (16) that are switched on or off thereby controlling the drain voltage (2) which is varying for example due to antenna mismatch. The power amplifier may further comprise a memory (24) coupled to the voltage sensing module (22) for storing a history of the drain voltage (2), e.g. a history of antenna mismatch.

12 Claims, 8 Drawing Sheets

U.S. PATENT DOCUMENTS

2007/0129029 A1    6/2007    Litmanen
2011/0120738 A1*   5/2011    Miwa et al. .................. 173/2

OTHER PUBLICATIONS van Bezooijen, A., et al. "Adaptively Preserving Power Amplifier Linearity Under Antenna Mismatch", 2004 IEEE MTT-S Digest, pp. 1515-1518 (Jun. 2004).

Scuderi, A., et al. "A VSWR-Protected Silicon Bipolar RF Power Amplifier with Soft-Slope Power Control", IEEE J. of Solid-State Circuits, vol. 40, No. 3, pp. 611-621 (Mar. 2005).

Tabrizi, M., et al. "A New Topology for Power Control of High Efficiency Class-E Switched Mode Power Amplifier", Proc. $5^{th}$ Int'l. Workshop on System-on-Chip for Real-Time Applications, pp. 92-95 (2005).

Rofougaran, M., et al. "A 900 MHz CMOS RF Power Amplifier with Programmable Output", IEEE 1994 Symp. on VLSI Circuits Digest of Technical Papers, pp. 133-134 (1994).

International Search Report and Written Opinion for Int'l Patent Application No. PCT/IB2009/055687 (May 7, 2010).

* cited by examiner ized in FIG. 1, where, for a class-E power amplifier 1,
POWER AMPLIFIER PROTECTION The present invention relates to power amplifiers. The present invention is particularly suited to, but not limited to, low-breakdown voltage power amplifiers.

An important issue for power amplifiers, in particular power amplifiers with low breakdown voltage such as CMOS Power Amplifiers (PA) is reliability in the presence of antenna mismatch. When the voltage exceeds a certain reliable voltage level the power transistor experiences gate oxide breakdown. Especially in the presence of antenna mismatch issues, switching PAs can have high voltage on the drain of the power transistor eventually degrading the performance if no precaution is taken to reduce the high voltage. This aspect of high voltage on the drain of the power transistor is shown schematically in FIG. 1, where, for a class-E power amplifier 1, drain voltage location is indicated by reference numeral 2, the power transistor is indicated by reference numeral 3, a filtering module comprising inductance $L_0$ and capacitance $C_0$ is indicated by reference numeral 4, a matching network comprising inductance $L_m$ and capacitance $C_m$ is indicated by reference numeral 6, antenna position is indicated by reference numeral 8, the antenna being represented by a variable impedance X and a variable resistance R.

In FIG. 2, a simulation result for the class-E switching PA 1 is given for different load reflection phase angles (VSWR=10) showing that the peak voltage on the drain of the power transistor (the plot indicated by reference numeral 10) can be more than 1.5 times higher than optimum situation of no-mismatch which is shown by the plot indicated by reference numeral 12. If no precaution is taken the high peak voltage can destroy the transistor in a few milliseconds of time depending on the transistor technology used and how high the drain peak voltage is.

Known methods for solving the problem of antenna mismatch are based upon analog methods. Known methods include voltage limiting by using diodes, as described for example in "Adaptively preserving power amplifier linearity under antenna mismatch", Van Bezooijen, A.; Chanlo, C.; van Roermund, A. H. M.; Microwave Symposium Digest, 2004 IEEE MTT-S International Volume 3, 6-11 June 2004 Page(s):1515-1518 Vol.3, and adapting the biasing conditions, as described for example in "A VSWR-Protected Silicon Bipolar RF Power Amplifier With Soft-Slope Power Control", Angelo Scuderi et. al. IEEE JOURNAL OF SOLID-STATE CIRCUITS, VOL. 40, NO. 3, MARCH 2005.

Another known technique is changing the supply voltage (VDD) by using DC-DC converters in order to prevent the breakdown. However, the large size of DC-DC converters is a disadvantage with this technique.

Quite separately, and for purposes other than solving the problem of antenna mismatch, methods are known of partitioning the transistor of a power amplifier into smaller segments to control peak voltage, output power etc. Examples are described in Patent Abstracts of Japan JP 10-079654, and in "A New Topology for Power Control of High Efficiency Class-E Switched Mode Power Amplifier", Tabrizi, M. M.; Masoumi, N., Fifth International Workshop on System-on-Chip for Real-Time Applications (IWSOC'05) pp. 92-95.

The present inventors have realised that providing a record of antenna mismatch could be useful in understanding the conditions under which the antenna mismatch is occurring (e.g. the user interference on the antenna on a hand-held device etc.). The present inventors have further realised it would be desirable to avoid increasing the circuit size as is the case with the known methods that adapt supply voltage by using DC-DC converters.

In a first aspect, the present invention provides a power amplifier, comprising: a plurality of power transistors connected to provide a partitioned power transistor; and a voltage sensing module arranged to digitally sense the drain voltage of the partitioned power transistor and to control the number of power transistors of the plurality of power transistors that are switched on or off thereby controlling the drain voltage.

The drain voltage to be controlled may vary due to antenna mismatch.

The voltage sensing module may comprise a plurality of voltage dividers and inverters.

The power amplifier may further comprise a memory coupled to the voltage sensing module for storing a history of the drain voltage.

The history of the drain voltage may provide a history of antenna mismatch.

The number of power transistors in the plurality of power transistors may be twelve.

The power amplifier may be a class-E switching power amplifier.

In a further aspect, the present invention provides a method of operating a power amplifier, the method comprising: digitally sensing the drain voltage of a partitioned power transistor of the power amplifier, where the partitioned power transistor is provided by a plurality of power transistors arranged in parallel, and dependent on the sensed value controlling the number of power transistors of the plurality of power transistors that are switched on or off thereby controlling the drain voltage.

The drain voltage to be controlled may vary due to antenna mismatch.

The step of digitally sensing the drain voltage may be performed by a sensing module comprising a plurality of voltage dividers and inverters.

The method may further comprise storing a history of the drain voltage in a memory.

The history of the drain voltage may provide a history of antenna mismatch.

The number of power transistors in the plurality of power transistors may be twelve.

The power amplifier may be a class-E switching power amplifier.

In aspects of the invention, digital sensing of the high voltage may be performed to protect the power transistor.

In aspects of the invention, a sensing mechanism may be provided to use voltage information (digital) to keep track of the breakdown history.

In aspects of the invention, a simple mechanism of sensing voltage in a digital manner may be provided and the information obtained may be used to prevent oxide breakdown and also to keep track of the antenna mismatch information.

In aspects of the invention, a method may be provided to sense the high voltage and prevent breakdown of the power amplifier against antenna mismatch. In comparison to existing methods, aspects of the invention may make use of digital concepts allowing implementation in CMOS technology, allowing the use of monolithic integration.

In aspects of the invention, simple detection circuitry may be provided to allow the possibility of preventing the breakdown of the power transistor against antenna mismatch issues by using digital circuit concepts. Using digital circuit concepts allows the keeping of a record of the antenna mismatch.

Embodiments of the present invention will now be described, by way of example, with reference to the accompanying drawings, in which.

Figure 3:
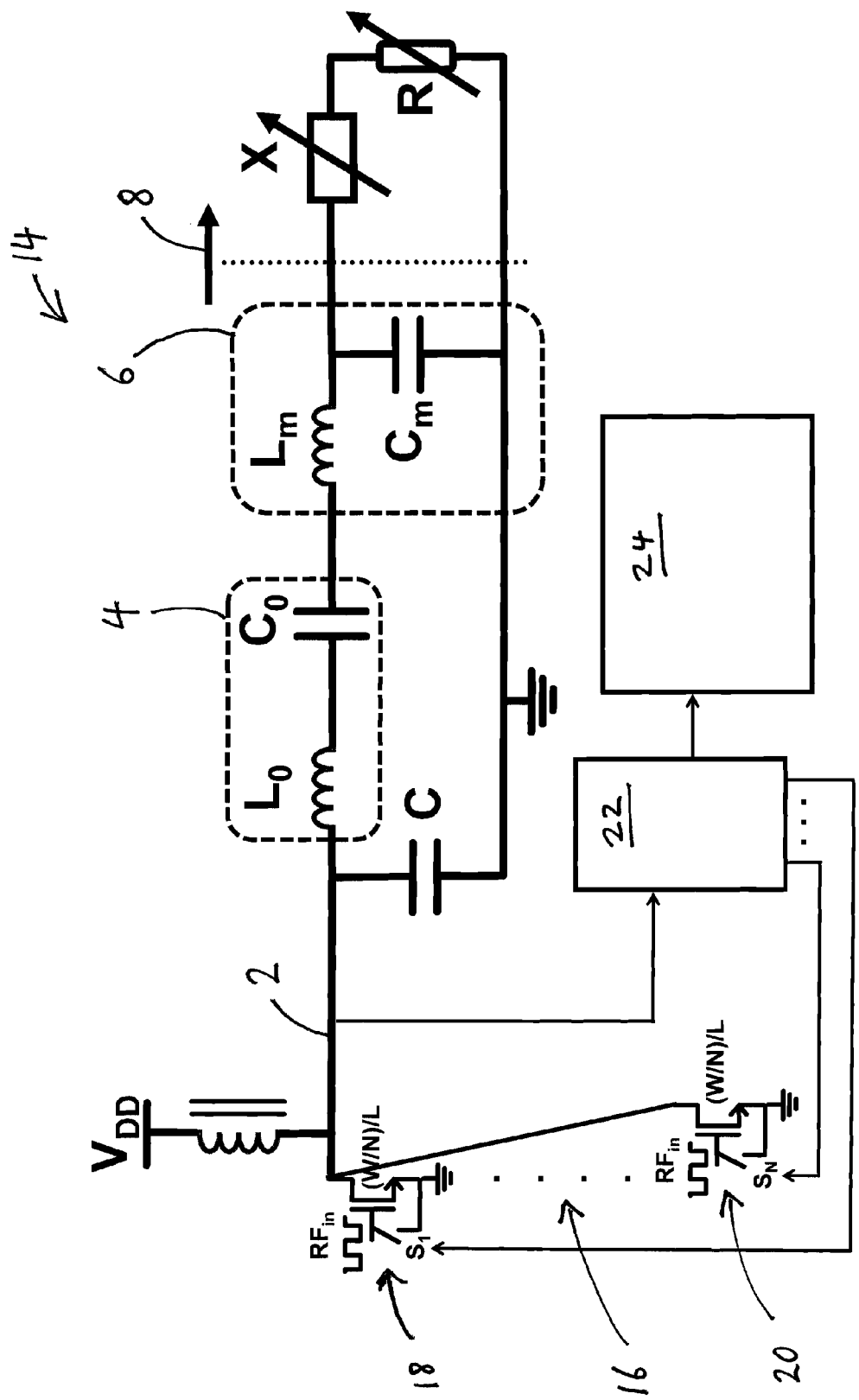
FIG. 3 is a block circuit diagram of a power amplifier.
Figure 4:
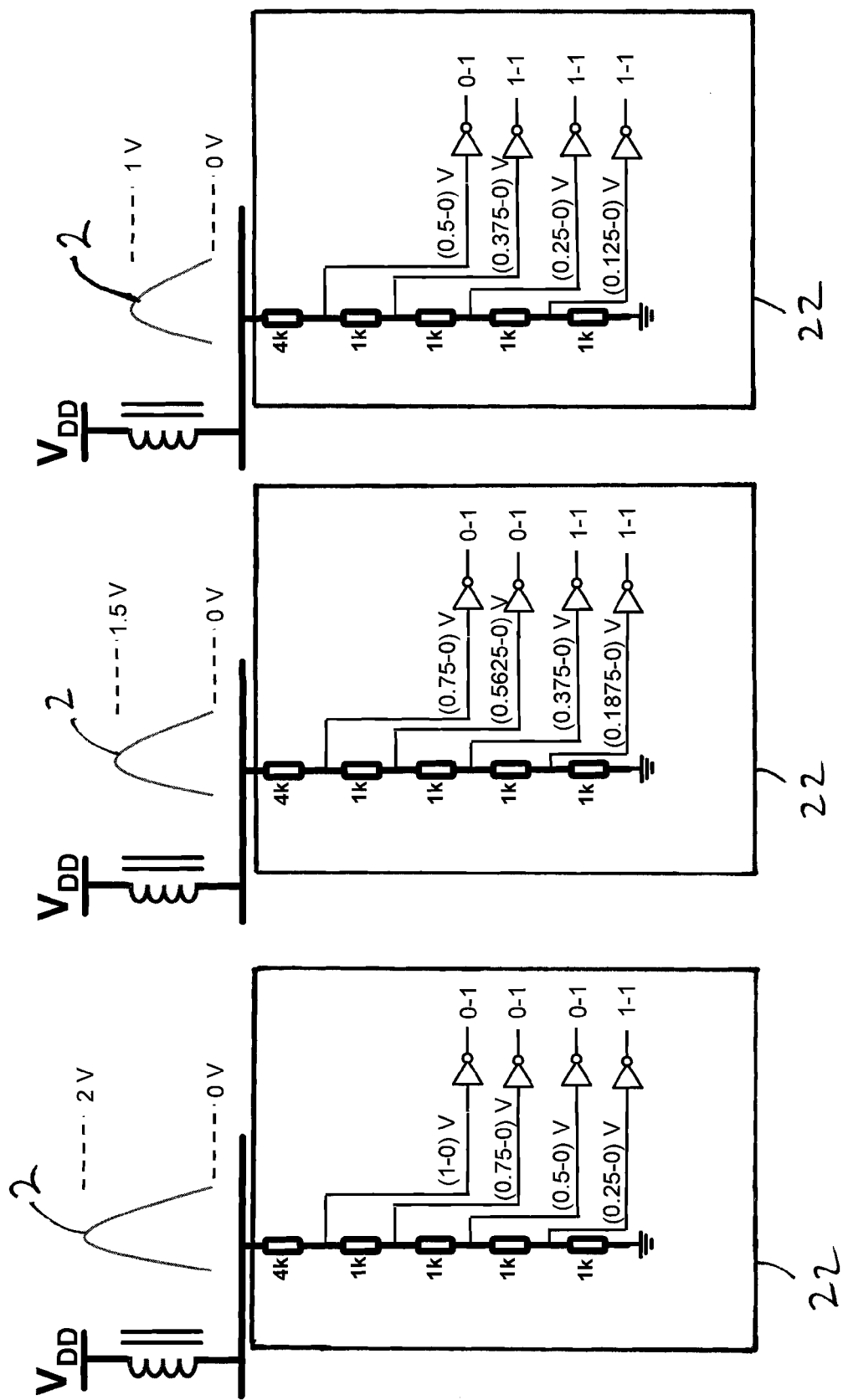
Figure 5:
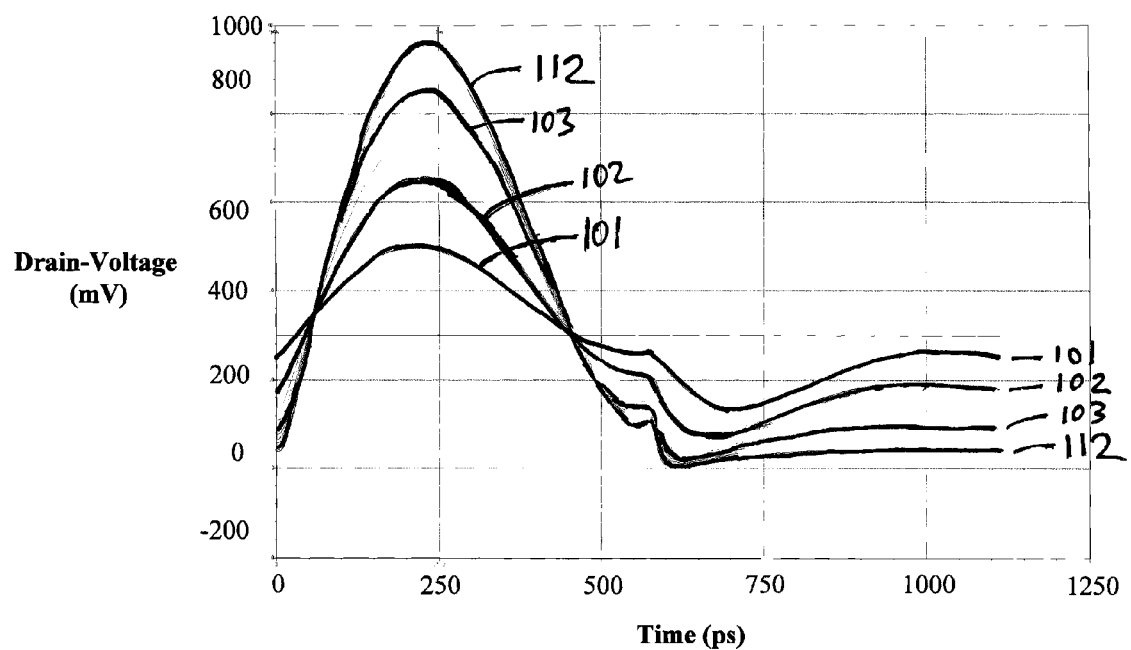
Figure 6:
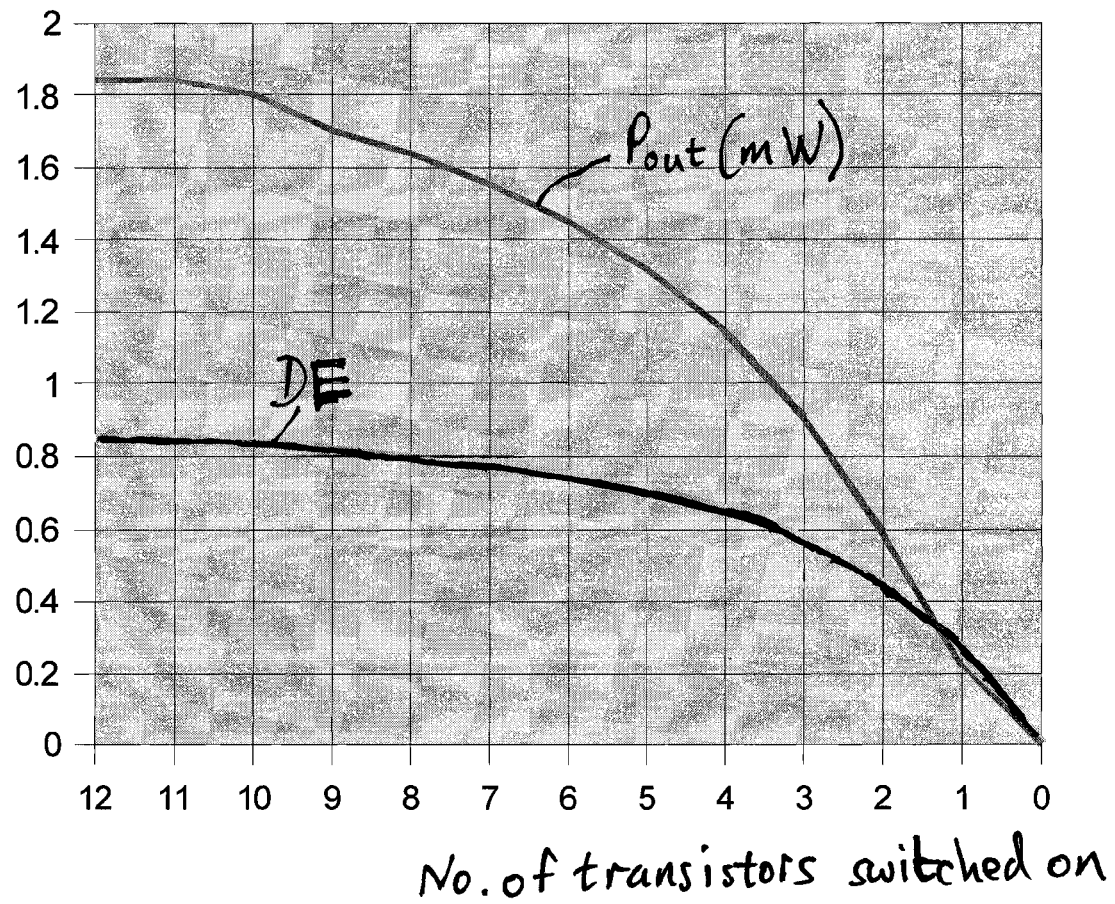
Figure 7:
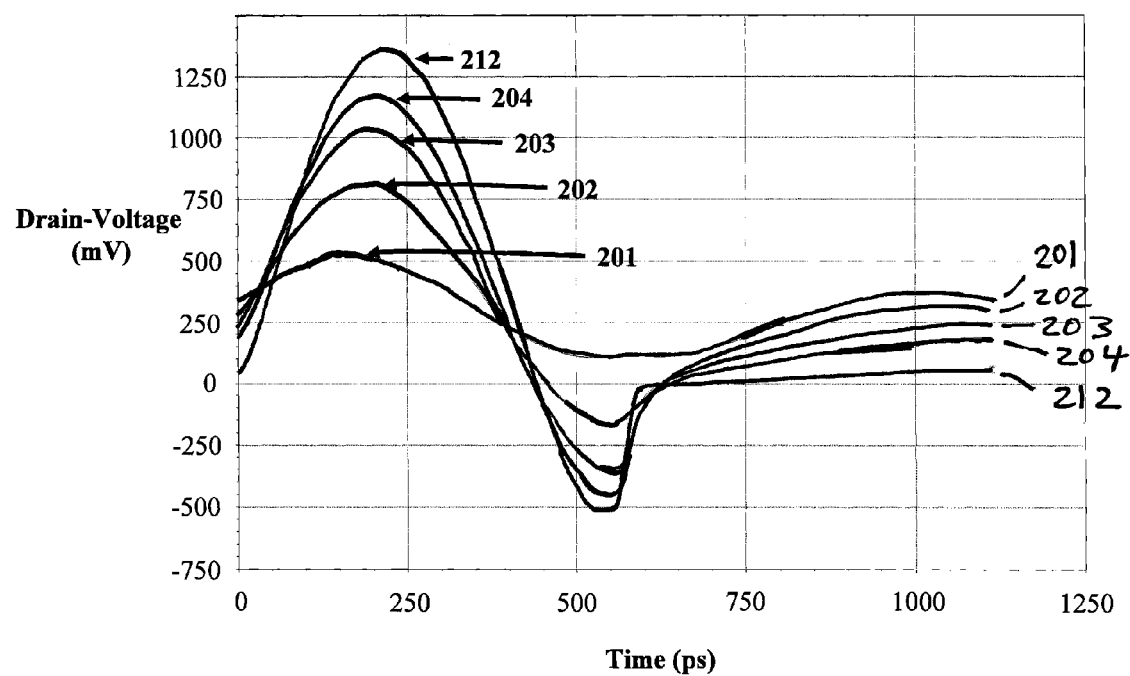
Figure 8:
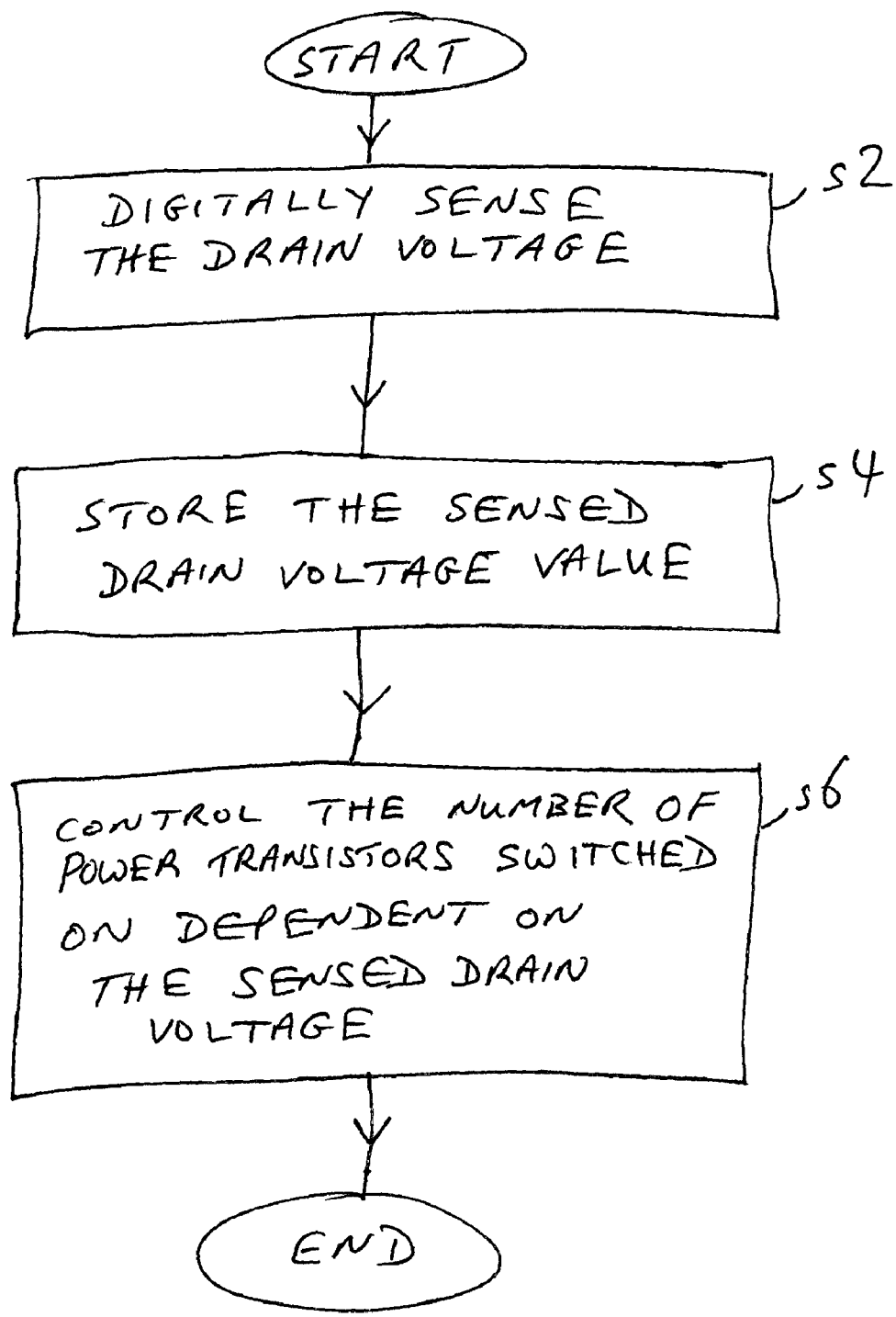

FIGS. 4a-c are block circuit diagrams showing further details of the implementation of a voltage sensing module of the power amplifier of FIG. 3;

FIG. 5 shows plots of drain voltage against time for different numbers of power transistors switched on;

FIG. 6 shows plots of the variation of both drain efficiency (DE) and output power ($P_{out}$ in mW) against the number of power transistors switched on;

FIG. 7 shows plots of the drain voltage against time for different numbers of power-transistors switched on for an antenna mismatch scenario; and FIG. 8 is a process flow chart showing certain process steps of an embodiment of a method of operating the power amplifier of FIG. 3.

Figure 1:
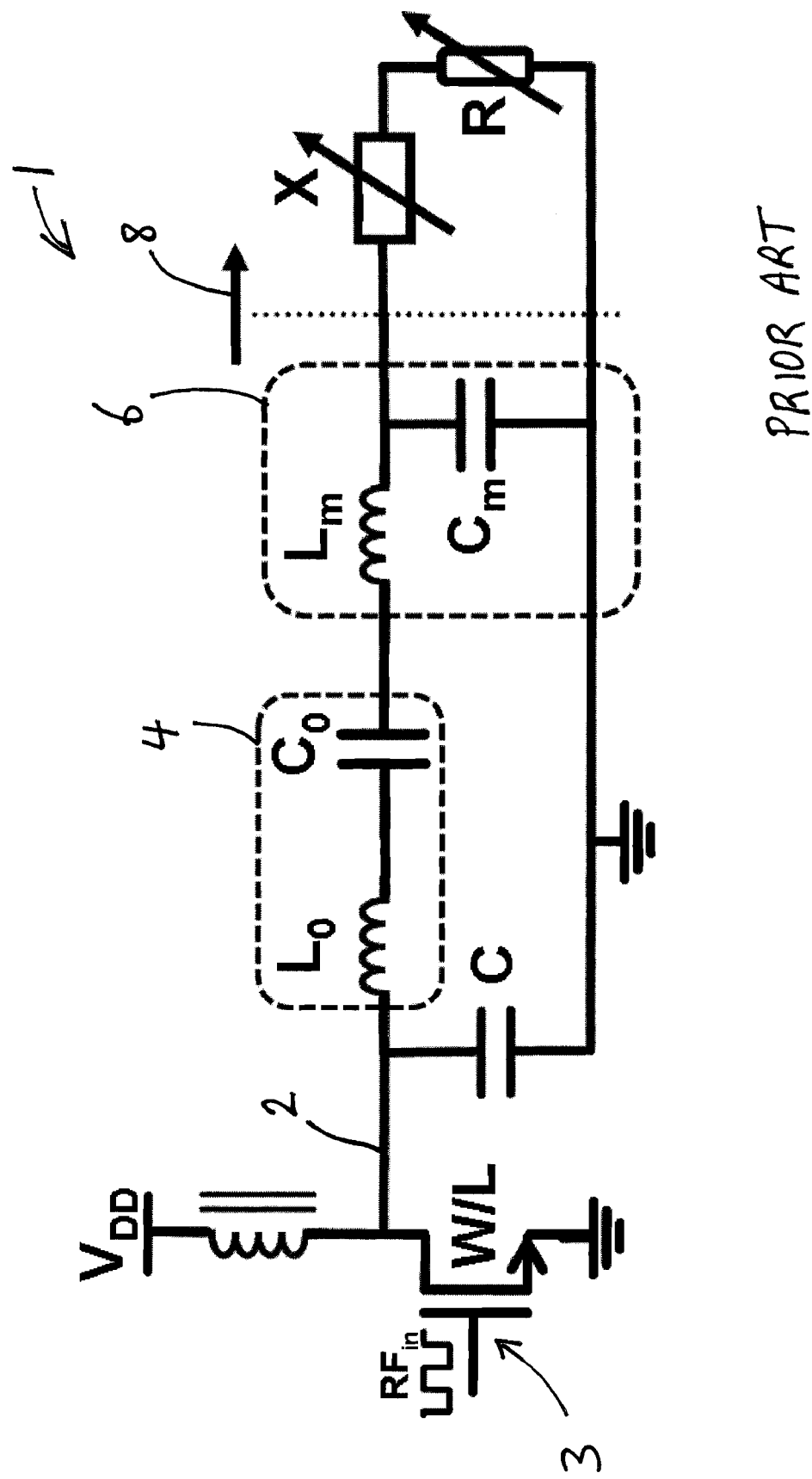
FIG. 1 is a block circuit diagram of a prior art power amplifier.

FIG. 3 is a block circuit diagram of a power amplifier 14 according to a first embodiment of the invention. Elements corresponding to those described with reference to FIG. 1 are shown by the same reference numerals. The power amplifier 14 comprises a filtering module 4 and a matching network 6.

The filtering module 4 comprises an inductance $L_0$ and a capacitance $C_0$. The matching network 6 comprises an inductance $L_m$ and a capacitance $C_m$. The power amplifier 14 further comprises a plurality of N power transistors 16 connected in parallel and representing a partitioning of a transistor such as the transistor 3 of the conventional power amplifier 1 shown in FIG. 1. For convenience, only the first power transistor 18 and the Nth power transistor 20 of the plurality of N power transistors 16 are expressly shown in FIG. 3.

The power amplifier 14 further comprises a voltage sensing module 22 and a memory 24. The voltage sensing module 22 comprises an input coupled to the drain voltage 2. The voltage sensing module 22 further comprises a plurality of N outputs each coupled to the gate of a respective one of the plurality of N power transistors 16. The voltage sensing module 22 further comprises an additional output coupled to the memory 24. The memory 24 is for storing the mismatch history.

Also shown in FIG. 3 are a variable impedance X and a variable resistance R of a coupled antenna, whose position is shown by the arrow with reference numeral 8.

In this embodiment the peak voltage is sensed in a digital manner by using simple resistive dividers and inverters and this information is used to protect the power transistor and keep track of the high voltage history. The peak drain voltage 2 is sensed via the voltage sensing module 22 and depending on how high the peak drain voltage is the required number of the power transistors 16 transistors are switched-off to protect the power amplifier 14.

The voltage sensing module 22 may be implemented in any appropriate manner that provides digital sensing of the drain voltage 2. In this embodiment, the voltage sensing module 22 is implemented using voltage dividers and inverters. FIGS. 4a-c are block circuit diagrams showing further details of the implementation of the voltage sensing module 22 of this embodiment. As shown in each of FIGS. 4a-c, the voltage sensing module 22 comprises a plurality of resistors in series providing resistive voltage dividers. Each voltage division is coupled to a respective driver arranged as an inverter. In FIGS. 4a-c, three mismatch scenarios (thus three different drain voltages) are given respectively, one in FIG. 4a, one in FIG. 4b, and one in FIG. 4c. In each of FIGS. 4a-c the high peak voltage e of the drain voltage 2 is shown. In FIG. 4a the high peak voltage (2V) is first lowered to a low reliable voltage level (1V) by using resistive dividers. Each voltage level is connected to a driver to obtain a digital output (0, 1). The threshold level for the inversion of inverters is assumed to be 0.5 V. As shown in FIG. 4a, while the output of the first three inverters are changing between 0-1 the fourth driver's output is always kept at logic 1 level. In each of the scenarios described in FIGS. 4a-c different numbers of inverters have constant output logic of 1. In FIG. 4a the number of inverters having constant output logic of 1 is one; in FIG. 4b (where the high peak voltage is 1.5V) the number of inverters having constant output logic of 1 is two; in FIG. 4c (where the high peak voltage is 1.5V) the number of inverters having constant output logic of 1 is three. This is used to detect the level of the peak drain voltage. (As mentioned above, in other embodiments, other voltage sensing techniques may be used, e.g. ND converters, peak detectors etc.) The resulting digital information is used to switch-off the required number of transistors. High voltage levels are recorded to the memory 24 to keep a record of antenna mismatch.

For CMOS technology it has been shown (for example in "Oxide Breakdown After RF Stress: Experimental Analysis And Effects On Power Amplifier Operation", L. Larcher, et. al., IEEE IRPS, San Jose, 2006) that the time to oxide breakdown is much longer under RF conditions (>1 GHz) than under DC conditions. Therefore, by allowing the capability for the high peak voltage to be reduced in a few RF-cycles time, the present embodiment allows the capability to save the power transistors 16 of the power amplifier. In particular this embodiment tends to provide a decrease the high peak drain voltage in a few RF-cycles.

This embodiment makes use of breakdown protection by dividing the power transistor 3 of a conventional power amplifier 1 as shown in FIG. 1 into N smaller power transistors 16 as shown in FIG. 3. By switching-off a certain number of power transistors 16 depending on how high the peak drain voltage 2 is the peak drain voltage 2 can be reduced, a shown schematically in FIG. 5. FIG. 5 shows plots of drain voltage against time for different numbers of power transistors switched on. Plot 101 shows the drain voltage when only one power transistor is switched on, plot 102 shows the drain voltage when only two power transistors are switched on, plot 103 shows the drain voltage when only three power transistors are switched on, and plot 112 shows the drain voltage when twelve power transistors are switched on.

Figure 2:
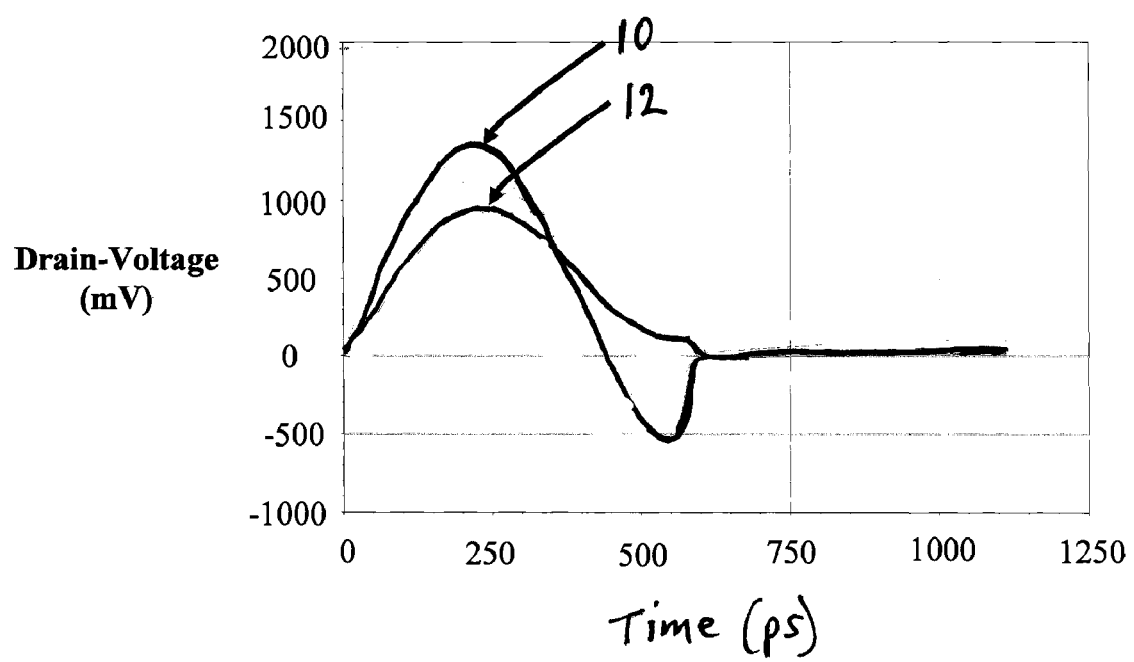
FIG. 2 is a simulation result for the power amplifier of FIG. 1 for different load reflection phase angles (VSWR=10)

FIG. 6 shows plots of the variation of both drain efficiency (DE) and output power ($P_{out}$ in mW) against the number of power transistors switched on. As the power transistors are switched-off both the drain efficiency and the output power decreases. Considering for example in FIG. 6 the range of 10 power transistors switched-on to 3 power transistors switched-on, $P_{out}$ drops from 1.8 mW to 0.9 mW whereas the efficiency drops from 80% to 60%. Therefore dividing the power transistor into N smaller switchable (on/off) transistors is useful for controlling both the peak drain voltage and the output power at the expense of only a relatively small degradation in drain efficiency. Considering for this embodiment a total of twelve power transistors in the plurality of power transistors, and an antenna mismatch corresponding to that shown by plot 10 in FIG. 2, by having only three of the power transistors switched-on (i.e. nine switched-off off) the high peak drain voltage is reduced to approximately to 1V. This is shown in FIG. 7 which shows plots of the drain voltage against time for different numbers of power-transistors switched on for this antenna mismatch scenario. Plot 201 shows the drain voltage when only one power transistor is switched on, plot 202 shows the drain voltage when only two power transistors are switched on, plot 203 shows the drain voltage when only three power transistors are switched on, plot 204 shows the drain voltage when only three power transistors are switched on, and plot 212 shows the drain voltage when twelve power transistors are switched on.

FIG. 8 is a process flow chart showing certain process steps of an embodiment of a method of operating the above described power amplifier.

At step s2, the voltage sensing module 22 digitally senses the drain voltage 2, as described earlier above using the above described resistive voltage dividers and inverters.

At step s4, the sensed drain voltage value is stored in the memory 24. Over the course of time, this provides a stored drain voltage history, which is an antenna mismatch history when the drain voltage variation is due to antenna mismatch.

At step s6, the number of the power transistors that are switched on or switched off is controlled dependent on the sensed drain voltage value, thereby controlling the drain voltage in a feedback procedure.

In the above embodiments, the digitally sensed drain voltage values are stored in the memory 24. This provides a particularly advantageous use of the digitally sensed values, for example being useful in experiments of external effects on the antenna impedance variations (e.g. human factor on handheld device antennas etc.). However, in other embodiments the step of storing, and the memory itself, may be omitted, whilst still retaining other advantages of the use of digitally sensed values, such as convenient direct correspondence to the number of transistors to be switch on or off.

The invention may be applied in any power amplifier, and is particularly suited to class-E switching power amplifiers. The invention is particularly advantageously employed in applications where the antenna impedance is varying by undesirable external effects (e.g. hand held devices communicating wirelessly), i.e. where the drain voltage of the power amplifier is being controlled in response to undesired drain voltage levels arising from antenna mismatch. However, this need not be the case, and the invention may also be applied to control the drain voltage of a power amplifier when the drain voltage varies undesirably for reasons other than antenna mismatch.

The invention claimed is:

1. A power amplifier, comprising:
   a plurality of power transistors connected to provide a partitioned power transistor; and
   a voltage sensing module, comprising a plurality of voltage dividers and inverters, arranged to digitally sense a drain voltage of the partitioned power transistor and to control a number of power transistors of the plurality of power transistors that are switched on or off, thereby controlling the drain voltage.

2. The power amplifier according to claim 1, wherein the drain voltage to be controlled varies due to an antenna mismatch.

3. The power amplifier according to claim 1, wherein the power amplifier further comprises:
   a memory, coupled to the voltage sensing module, configured to store a history of the drain voltage.

4. The power amplifier according to claim 2, wherein the power amplifier further comprises:
   a memory, coupled to the voltage sensing module, configured to store a history of the drain voltage, wherein the history of the drain voltage provides a history of the antenna mismatch.

5. The power amplifier according to claim 1, wherein a number of power transistors in the plurality of power transistors is twelve.

6. The power amplifier according to claim 1, wherein the power amplifier is a class-E switching power amplifier.

7. A method of operating a power amplifier, the method comprising:
   providing a partitioned power transistor by a plurality of power transistors arranged in parallel, and dependent on a sensed value;
   controlling a number of power transistors of the plurality of power transistors that are switched on or off, thereby controlling the drain voltage; and
   digitally sensing, with a sensing module comprising a plurality of voltage dividers and inverters, a drain voltage of the partitioned power transistor of the power amplifier.

8. The method according to claim 7, wherein the drain voltage to be controlled varies due to an antenna mismatch.

9. The method according to claim 7, further comprising storing a history of the drain voltage in a memory.

10. The method according to claim 8, further comprising:
    storing a history of the drain voltage in a memory, wherein the history of the drain voltage provides a history of the antenna mismatch.

11. The method according to claim 7, wherein a number of power transistors in the plurality of power transistors is twelve.

12. The method according to claim 7, wherein the power amplifier is a class-E switching power amplifier.

* * * * *